United States Patent
Shiu et al.

(10) Patent No.: US 7,279,409 B2
(45) Date of Patent: Oct. 9, 2007

(54) METHOD FOR FORMING MULTI-LAYER BUMPS ON A SUBSTRATE

(75) Inventors: Hei Ming Shiu, Hong Kong (HK); On Lok Chau, Hong Kong (HK); Gor Amie Lai, Hong Kong (HK)

(73) Assignee: Freescale Semiconductor, Inc, Austin, TX (US)

( * ) Notice: Subject to any disclaimer, the term of this patent is extended or adjusted under 35 U.S.C. 154(b) by 179 days.

(21) Appl. No.: 11/263,440

(22) Filed: Oct. 31, 2005

(65) Prior Publication Data

US 2007/0099413 A1   May 3, 2007

(51) Int. Cl.
*H01L 21/44* (2006.01)
*H01L 23/48* (2006.01)

(52) U.S. Cl. .................. 438/614; 257/738; 257/780

(58) Field of Classification Search ............. 257/737, 257/738, 779–784, E23.01–E23.02, E23.023–E23.079, 257/E23.141–E23.179; 438/610–614, 123, 438/461

See application file for complete search history.

(56) References Cited

U.S. PATENT DOCUMENTS

| | | | |
|---|---|---|---|
| 5,470,787 A | 11/1995 | Greer | |
| 5,672,542 A * | 9/1997 | Schwiebert et al. | 438/4 |
| 5,880,017 A | 3/1999 | Schwiebert et al. | |
| 6,109,507 A * | 8/2000 | Yagi et al. | 427/97.2 |
| 2002/0064930 A1 | 5/2002 | Ishikawa | |

FOREIGN PATENT DOCUMENTS

| | | |
|---|---|---|
| JP | 07153764 A | 6/1995 |
| JP | 2002 076043 A | 3/2002 |

* cited by examiner

*Primary Examiner*—Calvin Lee
(74) *Attorney, Agent, or Firm*—Charles Bergere

(57) ABSTRACT

A method for forming multi-layer bumps on a substrate includes depositing a first metal powder on the substrate, and selectively melting or reflowing a portion of the first metal powder to form first bumps. A second metal powder is then deposited on the first bumps, and melted to form second bumps on the first bumps. A masking plate is disposed over the substrate to select the portions of the metal powders that are melted and the metal powders are melted via an irradiation beam. The multi-layer bump is formed without the need for any wet chemicals.

13 Claims, 2 Drawing Sheets

METHOD FOR FORMING MULTI-LAYER BUMPS ON A SUBSTRATE

BACKGROUND OF THE INVENTION

The present invention relates to a method for forming bumps on a semiconductor chip or printed circuit board (PCB) environment. More particularly, the present invention relates to a method for forming multi-layer connectors for flip chip bonding using metal powders and localized irradiation.

A typical flip chip assembly uses a direct electrical connection of a face-down semiconductor chip onto a substrate or circuit board via conductive bumps. Generally, a flip chip assembly is made in three stages, i.e., forming bumps on a chip, attaching the bumped chip to a board or substrate, and filling the space remaining under the bumped chip with an electrically non-conductive material.

A conductive bump has several functions in a flip chip assembly, such as, providing an electrical connection between a semiconductor chip and a substrate, and providing a thermally conductive path to carry heat from the semiconductor chip to the substrate. The bump also provides part of the mechanical mounting to the substrate and acts as a spacer for preventing electrical contact between the semiconductor chip and substrate conductors.

There are many methods of forming bumps on a wafer substrate. One method of forming bumps includes forming a photoresist layer having openings aligned with bond pads on the wafer substrate, applying a solder paste in the openings by screen printing, and then melting or reflowing the solder paste to form a bump. The openings may be formed by radiating and developing the photoresist.

One problem of this method is that a new photoresist layer is required for processing each piece of wafer substrate. Another problem is the need for removal of the photoresist layer by chemical solutions, which generates chemical wastes. Yet another problem is that bump standoff (bump height) depends on the thickness of the photoresist mask. To obtain a higher standoff, a thicker photoresist layer is required.

However, if a low or fine pitch (bump spacing) is required, the maximum possible thickness of the photoresist layer is limited. In practice, the openings in the photoresist layer typically have a reverse conical shape, i.e., the openings taper towards a narrow end at the bond pads. Hence, there is a tradeoff between a high standoff and a low pitch.

Another method of forming bumps involves patterning a photoresist layer applied to a wafer substrate to form bump sites and electroplating a solder alloy onto the bump sites. The photoresist layer is then removed before reflowing the solder alloy to form a sphere. While this electroplating method provides a low pitch, one problem is that wet chemicals or plating bath solutions are required. Further, such chemical processes involve hazardous materials and have to be carefully controlled.

In view of the foregoing, it would be desirable to have a method for forming bumps that is low cost and does not involve wet chemicals. In addition, it would be desirable to have a method that provides high standoff (bump height) and low or fine pitch (bump spacing).

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION OF THE INVENTION

A method for forming multi-layer bumps or connectors on a substrate in a semiconductor chip or printed circuit board (PCB) environment is provided. In the following description, numerous specific details are set forth in order to provide a thorough understanding of the present invention. It will be understood, however, to one skilled in the art, that the present invention may be practiced without some or all of these specific details. In other instances, well known process operations have not been described in detail to not unnecessarily obscure the present invention.

Figure 1:
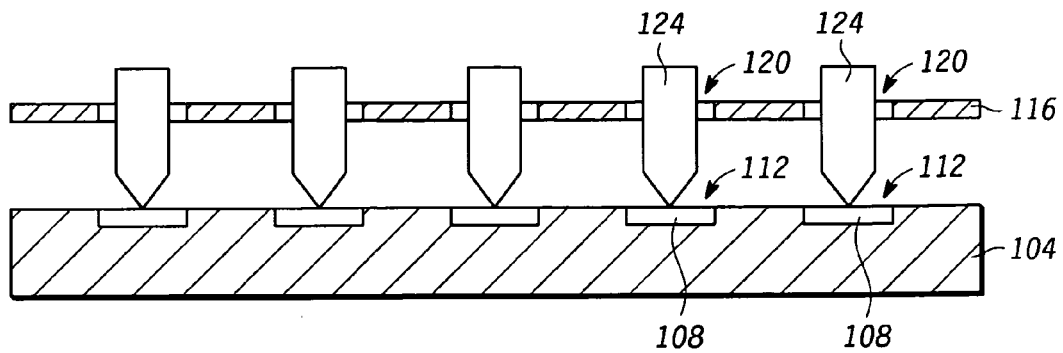
FIG. 1 illustrates an enlarged cross-sectional view of a semiconductor wafer in accordance with one embodiment of the present invention.

Referring now to FIG. 1, an enlarged, cross-sectional view of a semiconductor chip or wafer or PCB substrate 104 in accordance with one embodiment of the present invention is shown. The substrate 104 includes a number of bond pads 108 for defining bump sites 112 on which bumps may be formed. Before forming the bumps, the substrate 104 is cleaned to remove contaminants, such as aluminum oxide, from the bond pads 108.

To accomplish such cleaning, a masking plate 116 patterned with one or more apertures 120 is disposed over the substrate 104 such that the apertures 120 are aligned with the bump sites 112. A localized irradiation beam 124, such as, infrared or laser beam is provided over the masking plate 116 and directed at the bump sites 112. The beam 124 burns out any contaminants on the pads 108.

The apertures 120 allow the irradiation beam to pass through to the bump sites 112 while the masking plate 116 blocks the beam from irradiating the rest of the substrate 104. The masking plate 116 may be made of metal or ceramic materials, and may have a thickness of about 500 microns to about 1 millimeter. The apertures 120 may have diameters from about 40 microns to about 60 microns, to closely match the size of the bond pads 108.

Figure 2:
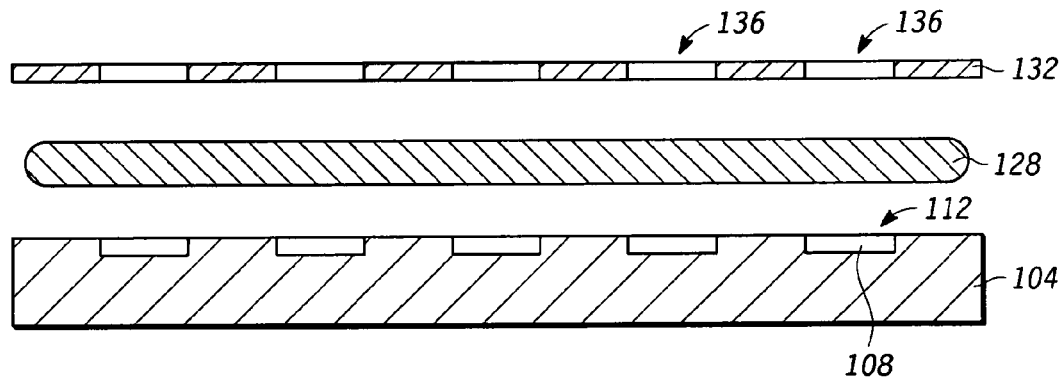
FIG. 2 illustrates an enlarged cross-sectional view of the semiconductor wafer of FIG. 1 having a first metal powder in accordance with an embodiment of the present invention.

Referring now to FIG. 2, a cross-sectional view of the substrate 104 having a first metal powder 128 is shown. The first metal powder 128 is deposited over the substrate 104 to form a substantially uniform layer over the bump sites 112. A masking plate 132 with apertures 136 is disposed over the substrate 104 such that the apertures 136 on the masking plate 132 are aligned with the bump sites 112. The masking plate 132 can be the same as the masking plate 116 used to regulate the irradiation beam 124 as described in FIG. 1.

The first metal powder 128 preferably comprises copper or high lead solder and has a particle size of about 5 microns to about 10 microns. Though other particle sizes may also be used, it should be appreciated that larger particle sizes may result in larger bump sizes and bump pitch. Typically, but not limited to such, the metal powder chosen as the first metal powder 128 has a melting point of at least about 300 degrees Celsius.

Figure 3:
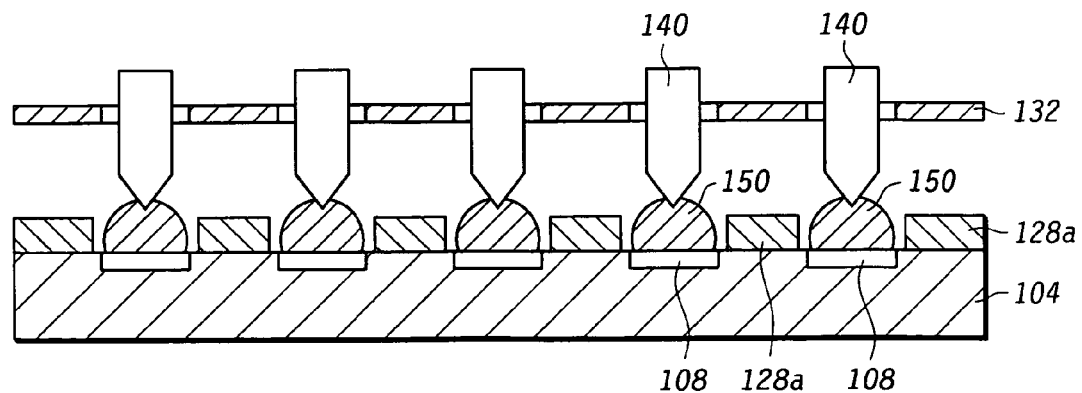
FIG. 3 illustrates an enlarged cross-sectional view of the semiconductor wafer of FIG. 2 during a first irradiation to the first metal powder in accordance with an embodiment of the present invention.

Referring now to FIG. 3, a cross-sectional view of the substrate 104 during a first irradiation of the first metal powder 128 is shown. A first irradiation beam 140 is fired through the masking plate (132 or 116), which directs the beam 140 at selected portions of the first metal powder 128 through the apertures (136 or 120). The selected portions of the first metal powder 128 are thus melted or reflowed to form a number of first bumps 150 on the bond pads 108. The first irradiation beam 140 may be any type of beam suitable for heating and melting the first metal powder, such as an infrared beam or a laser beam. At present, a laser beam is preferred because it is easy to focus.

Figure 4:
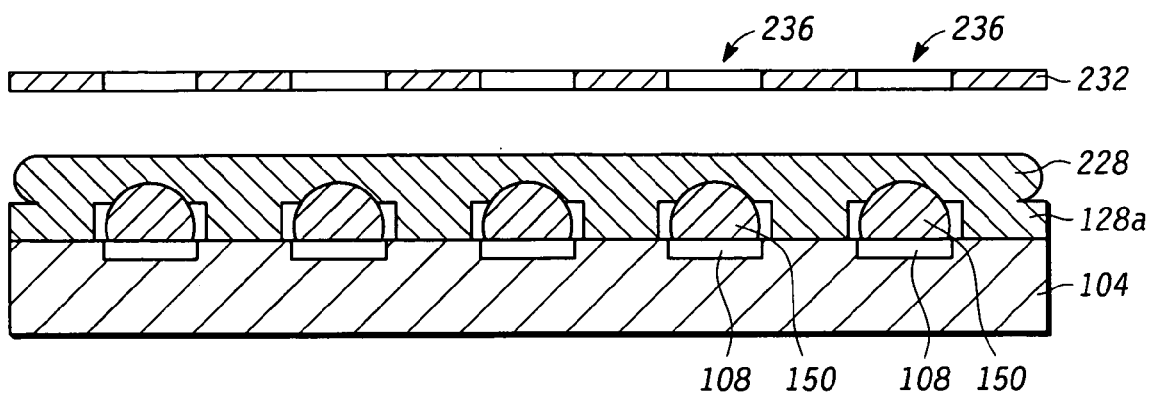
FIG. 4 illustrates an enlarged cross-sectional view of the semiconductor wafer of FIG. 3 having a second metal powder over first bumps in accordance with an embodiment of the present invention.

Referring now to FIG. 4, a cross-sectional view of the substrate 104 having a second metal powder 228 disposed over the substrate 104 and the first bumps 150 is shown. The second metal powder 228, preferably having a lower melting point than the first metal powder 128, is deposited over the first bumps 150 such as by sprinkling. Typically, but not limited to such, the melting point for the second metal powder 228 may range between about 150 degrees Celsius to about 200 degrees Celsius.

The second metal powder 228 may be a eutectic solder (tin-lead, for example) having a particle size of about 5 microns to about 10 microns, however, it should be appreciated that a larger particle size may result in larger bump size and bump pitch. A masking plate 232 is disposed over the second metal powder 228 such that apertures 236 in the masking plate 232 are aligned with the first bumps 150 upon which second bumps 250 are to be formed. The masking plate 232 can be the same as the masking plate 116 as described in FIG. 1, or the masking plate 132 as described in FIG. 2, or both.

Figure 5:
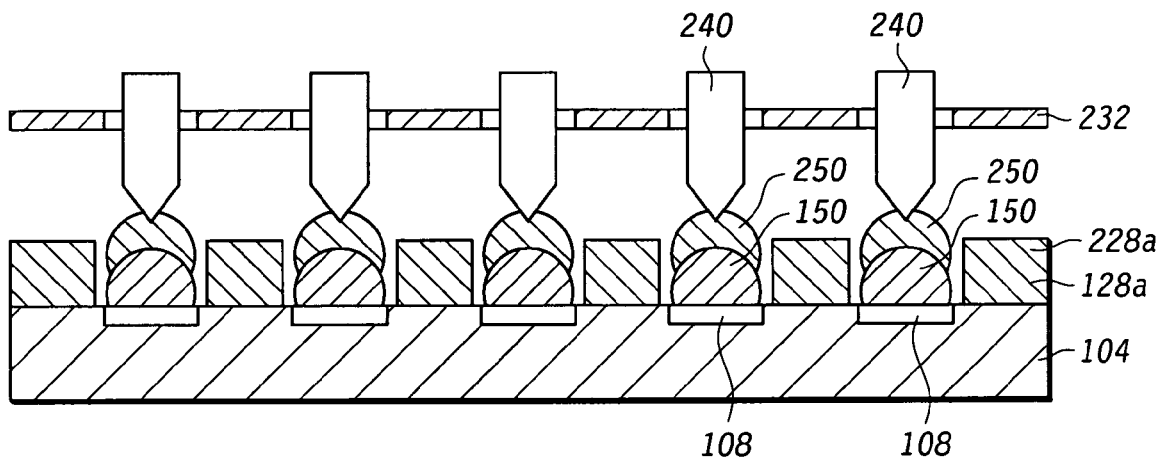
FIG. 5 illustrates an enlarged cross-sectional view of the semiconductor wafer of FIG. 4 during a second irradiation to the second metal powder in accordance with an embodiment of the present invention.

Referring now to FIG. 5, a cross-sectional view of the substrate 104 during a second irradiation of the second metal powder 228 is shown. A second irradiation beam 240 is fired through the masking plate (232, 132 or 116), which directs the irradiation beam 240 at selected portions of the second metal powder 228 through the apertures (236, 136 or 120). The selected portions of the second metal powder 228 are thus melted or reflowed to form a number of second bumps 250 on the first bumps 150. Because the second metal powder 228 has a lower melting point than the first metal powder 128, the first bumps 150 do not melt when the second metal powder 228 is melted or reflowed to form the second set of bumps 250.

The second irradiation beam 240 may be an infrared beam or a laser beam, which heats the second metal powder 228 to a stage at which it is sufficiently molten to bond with the first bumps 150. The second bumps 250 are then cooled and allowed to solidify. Finally, the unmelted portions of the first and second metal powders 128a and 228a are removed by, for example, air-blowing or spinning.

In another embodiment of the present invention, bumps may be formed on a pad metallurgy, which is provided on the bond pads 108. The pad metallurgy, also known as under-bump metallization (UBM), protects the substrate 104 and provides an electrical and mechanical connection between the bumps and an external substrate, such as a printed circuit board (PCB). The UBM generally comprises successive layers of metal formed on bond pads 108 by methods known to a person skilled in the art.

In another embodiment, the irradiation beam for melting or reflowing the metal powders (128, 228) and for cleaning bump sites 112 described above may be replaced with a programmable single laser beam. With the programmable single laser beam, heat for melting the metal powders (128, 228) can be more precisely directed at the bump sites 112. Hence, portions of the metal powders (128, 228) for forming the bumps (150, 250) can be selectively melted without necessarily requiring a masking plate to regulate heat exposure.

Figure 6:
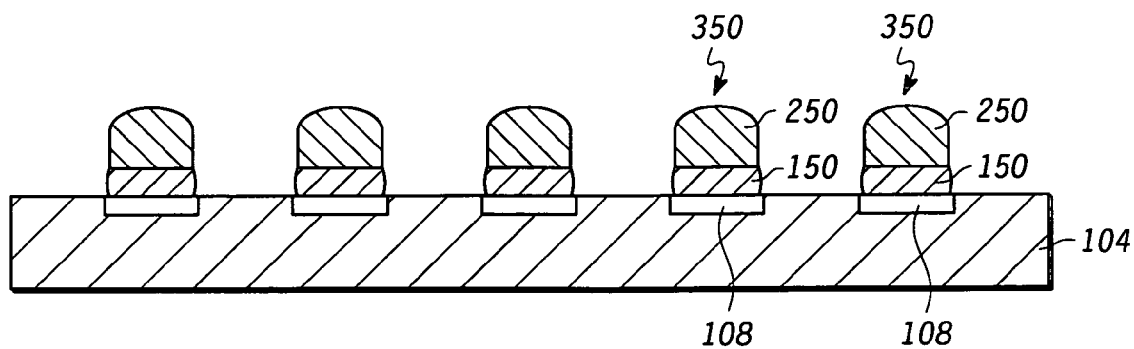
FIG. 6 is an enlarged cross-sectional view of a number of binal-layer metallic bumps formed on bond pads of a semiconductor wafer in accordance with an embodiment of the present invention.

Referring now to FIG. 6, a cross-sectional view of a number of binal-layer metallic bumps 350 formed on the bond pads 108 of the substrate 104 in accordance with one embodiment of the present invention is shown. Each binal-layer bump 350 includes a first bump 150 coupled to the bond pad 108, and a second bump 250 formed upon and coupled to the first bump 150. In a flip chip assembly, for example, the binal-layer bumps 350 provide connectors for electrically connecting the semiconductor substrate 104 to an external substrate in an electronic package. Generally, the first bump 150 provides standoff while the second bump 250 provides solder joint formation.

While the above process is described in relation to forming bumps on a substrate 104, the present invention is applicable to forming interconnects or bumps on PCB substrates. The above process is also applicable to forming a connector having more than the two layers of bumps. For example, a third bump of the connector can be formed by depositing a third metal powder over the second bump 250, and selectively melting or reflowing a portion of the third metal powder.

The present invention is particularly advantageous to reduce processing costs since it requires minimal tooling, involves no wet chemical processes, and utilizes a reusable masking plate. The masking plate may be eliminated if a programmable, single laser beam is used to selectively melt the metal powders.

Another advantage of the present invention is the high standoff that can be achieved by binal or multi-layer bumps as compared with single-layer bumps. At high temperatures, the silicon wafer and bumps are subject to thermal mechanical stress caused by different expansion rates in the silicon wafer and an external surface, such as PCB. The differing rates of expansion are due to coefficients of thermal expansion (CTE) mismatch in the different materials. Excessive stress may cause silicon fracture or bump fracture. A high standoff releases the stress caused by CTE mismatch and thereby improves bump joint reliability.

A further advantage of the present invention is reduced bump size and bump pitch. By forming the second bump 250 on the first bump 150, a high standoff is achieved without increasing bump size or diameter. This, in turn, allows a lower or finer bump pitch ranging from about 50 microns to about 75 microns depending on the metal powder particle size used and resolution of the apertures of the masking plate. In the embodiment where programmable laser beam is used, bump size and pitch depend on the resolution of the laser beam.

Other embodiments of the invention will be apparent to those skilled in the art from consideration of the specification and practice of the invention. Furthermore, certain terminology has been used for the purposes of descriptive clarity, and not to limit the present invention. The embodiments and preferred features described above should be considered exemplary, with the invention being defined by the appended claims.

The invention claimed is:

1. A method for forming a binal-layer bump on a substrate, comprising:
    depositing a first metal powder on the substrate;
    placing a first masking plate over the substrate, the first masking plate having at least one aperture;
    melting the first metal powder to form a first bump;
    depositing a second metal powder over at least the first bump; placing a second masking plate over the substrate, the second masking plate having at least one aperture; and
    melting the second metal powder to form a second bump on the first bump, wherein the first bump and the second bump form the binal-layer bump and wherein the binal-layer bump is surrounded by remaining portions of the first and second metal powders.

2. The method for forming a binal-layer bump according to claim 1, wherein melting the first metal powder further comprises:
    melting a selected portion of the first metal powder by irradiating the selected portion through the at least one aperture.

3. The method for forming a binal-layer bump according to claim 2, wherein melting the second metal powder further comprises:
    melting a selected portion of the second metal powder by irradiating the selected portion through the aperture of the second masking plate.

4. The method for forming a binal-layer bump according to claim 1, wherein a melting point of the second metal powder is lower than a melting point of the first metal powder.

5. The method for forming a binal-layer bump according to claim 1, wherein the first metal powder and the second metal powder each have a particle size between about 5 microns to about 10 microns.

6. The method for forming a binal-layer bump according to claim 5, wherein the first metal powder comprises one of copper and high lead solder and the second metal powder comprises a eutectic solder.

7. The method for forming a binal-layer bump according to claim 1, further comprising cleaning a bond pad on the substrate before depositing the first metal powder.

8. The method for forming a binal-layer bump according to claim 7, wherein the cleaning step comprises irradiating the bond pad to burn out any contaminants thereon.

9. The method for forming a binal-layer bump according to claim 1, wherein melting the first metal powder further comprises irradiating a portion of the first metal powder with a programmable single laser beam.

10. The method for forming a binal-layer bump according to claim 1, further comprising removing any unmelted portions of the first and second metal powders remaining on the substrate.

11. A method for forming a multi-layer connector on a substrate, comprising:
    depositing a first metal powder on the substrate;
    placing a first masking plate over the substrate, the first masking plate having at least one aperture;
    irradiating a selected portion of the first metal powder to form a first bump;
    depositing a second metal powder over the first bump; placing a second masking plate over the substrate, the second masking plate having at least one aperture; and
    irradiating the second metal powder to form a second bump on the first bump, wherein the first bump and the second bump form the multi-layer connector and wherein the binal-layer bump is surrounded by remaining portions of the first and second metal powders.

12. The method forming a multi-layer connector according to claim 11, wherein a melting point of the second metal powder is lower than a melting point of the first metal powder.

13. The method forming a multi-layer connector according to claim 11, wherein the first metal powder and the second metal powder each have a particle size between about 5 microns to about 10 microns.

* * * * *